United States Patent
Bekaert et al.

(10) Patent No.: US 11,856,734 B2
(45) Date of Patent: Dec. 26, 2023

(54) ELECTRONIC PACKAGE COMPRISING A COMPONENT TO BE COOLED AND ASSOCIATED MOUNTING METHOD

(71) Applicant: Continental Automotive Technologies GmbH, Hannover (DE)

(72) Inventors: Jean-Philippe Bekaert, Toulouse (FR); Gilles Le Roy, Toulouse (FR)

(73) Assignee: CONTINENTAL AUTOMOTIVE TECHNOLOGIES GMBH, Hannover (DE)

( * ) Notice: Subject to any disclaimer, the term of this patent is extended or adjusted under 35 U.S.C. 154(b) by 0 days.

(21) Appl. No.: 18/012,350

(22) PCT Filed: Jul. 7, 2021

(86) PCT No.: PCT/EP2021/068751
§ 371 (c)(1),
(2) Date: Dec. 22, 2022

(87) PCT Pub. No.: WO2022/008558
PCT Pub. Date: Jan. 13, 2022

(65) Prior Publication Data
US 2023/0232591 A1   Jul. 20, 2023

(30) Foreign Application Priority Data
Jul. 7, 2020 (FR) ........................................ 2007159

(51) Int. Cl.
*H05K 7/20* (2006.01)
(52) U.S. Cl.
CPC ..... *H05K 7/20509* (2013.01); *H05K 7/20163* (2013.01); *H05K 7/20172* (2013.01);
(Continued)

(58) Field of Classification Search
CPC ............ H05K 7/2049; H05K 7/20509; H05K 7/20854; H05K 7/20454; H05K 7/20863; H05K 7/20163; H05K 7/20172
See application file for complete search history.

(56) References Cited

U.S. PATENT DOCUMENTS

| | | | |
|---|---|---|---|
| 6,226,184 B1 * | 5/2001 | Stolz | H05K 7/2049 257/E23.09 |
| 10,356,948 B2 * | 7/2019 | Trygubova | H05K 1/0201 |

(Continued)

FOREIGN PATENT DOCUMENTS

FR   2995172 A1   3/2014

OTHER PUBLICATIONS

English Translation of the Written Opinion for International Application No. PCT/EP/2021/068751, dated Sep. 28, 2021, 6 pages.
(Continued)

*Primary Examiner* — Zachary Pape
(74) *Attorney, Agent, or Firm* — RatnerPrestia

(57) ABSTRACT

A set of electronic package elements intended to be mounted on an electronic board having a component to be cooled including: a chassis, a heatsink fixed by a retaining piece inside the chassis, a cover configured to be fixed on the chassis so as to retain the electronic board in the package. The heatsink is configured to be fixed on the electronic board while maintaining a predetermined distance between a lower face of the heatsink and the component. The cover is configured to be able to be fixed by a fixing point to the heatsink. The retaining piece is connected to the heatsink so as to allow the heatsink a translational movement relative to the chassis in three orthogonal directions.

7 Claims, 2 Drawing Sheets

(52) U.S. Cl.
CPC ..... *H05K 7/20454* (2013.01); *H05K 7/20863* (2013.01); *H05K 7/20854* (2013.01)

(56) References Cited

U.S. PATENT DOCUMENTS

| | | | |
|---|---|---|---|
| 10,721,840 B2* | 7/2020 | Trygubova | ................ F28F 3/00 |
| 2006/0060328 A1 | 3/2006 | Ewes et al. | |
| 2012/0113587 A1 | 5/2012 | Chuang et al. | |
| 2015/0264835 A1* | 9/2015 | Kohn | ................... H05K 7/2049 165/80.2 |
| 2015/0305137 A1* | 10/2015 | Hunt | ................... H01L 23/4006 361/697 |

OTHER PUBLICATIONS

International Search Report and Written Opinion for International Application No. PCT/EP/2021/068751, dated Sep. 28, 2021, 8 pages.

International Search Report and Written Opinion for International Application No. PCT/EP2021/068751, dated Sep. 28, 2021, 12 pages (French).

French Search Report for French Application No. 2007159, dated Mar. 22, 2021 with translation, 10 pages.

\* cited by examiner

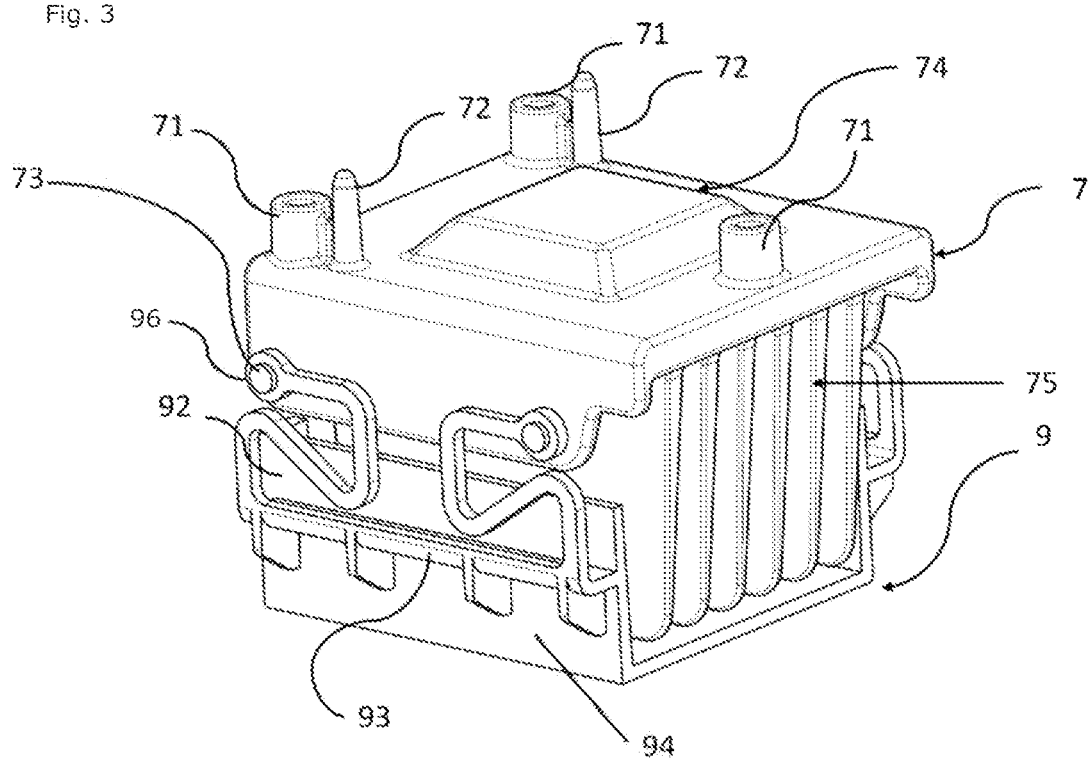
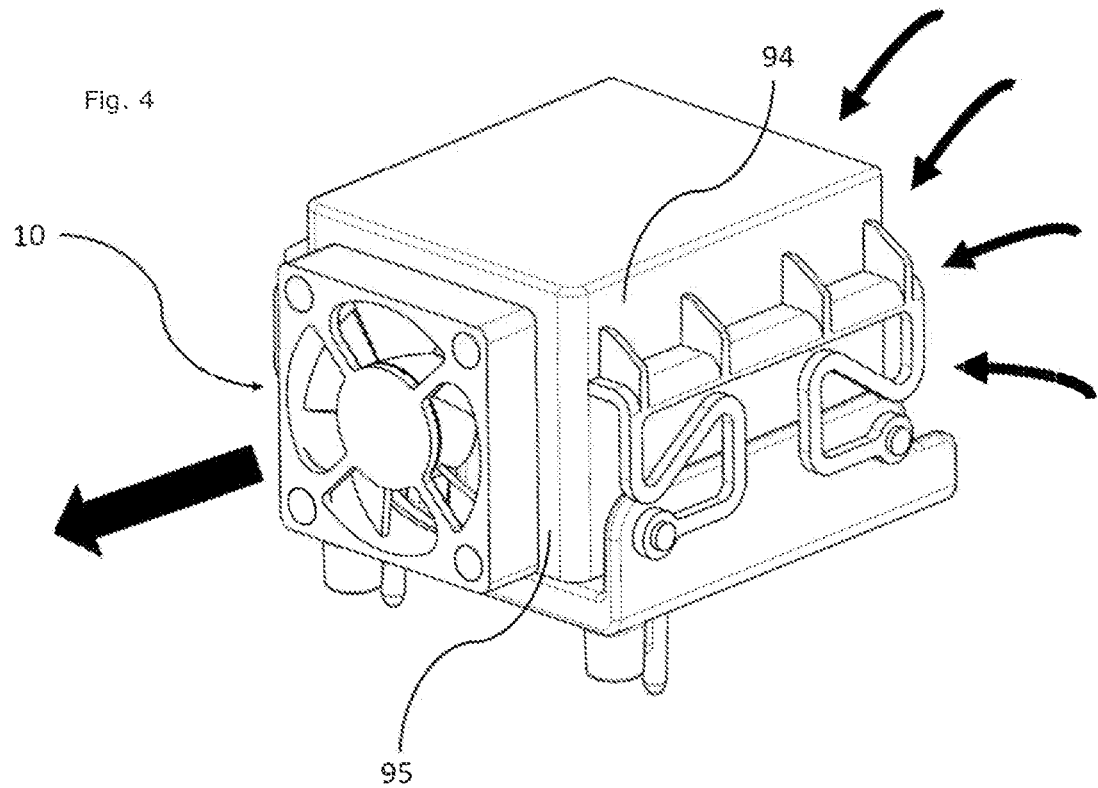

ELECTRONIC PACKAGE COMPRISING A COMPONENT TO BE COOLED AND ASSOCIATED MOUNTING METHOD

CROSS REFERENCE TO RELATED APPLICATIONS

This application is the U.S. National Phase Application of PCT International Application No. PCT/EP2021/068751, filed Jul. 7, 2021, which claims priority to French Patent Application No. 2007159, filed Jul. 7, 2020, the contents of such applications being incorporated by reference herein.

FIELD OF THE INVENTION

The present disclosure relates to the field of the cooling of electronic components in environments subject to strong vibrations in particular, such as in the automotive field for example.

BACKGROUND OF THE INVENTION

In the automotive field, increasingly powerful electronic components are used, in particular due to the development of new functionalities such as driving assistance or autonomous driving for example. There is therefore a need to propose a solution for cooling these components which can be subjected to strong vibrations while protecting them from their external environment.

The proposed cooling solutions must make it possible to effectively cool the component while guaranteeing good integrity of the component and of the electronic board on which the component is fixed. To do this, care must be taken to limit the stress to which the electronic board is subjected, which makes it possible in particular to avoid solder breaks or track breaks, and to limit structural weaknesses by using a maximum of rigid connections and by taking care to avoid natural resonant frequencies occurring. Moreover, it is also desirable to limit production costs by limiting the number of assembly steps and storage costs by limiting the number of parts to be assembled.

Various solutions have been proposed in an attempt to address these issues.

A first solution consists in fixing the electronic board on a base and in enclosing the electronic board and the component to be cooled in a rigid enclosure fixed on the base in order to form an electronic package. With a heatsink intended to be in thermal contact with the component to be cooled being fixed inside the enclosure in a rigid manner, a layer of thermal interface material, such as thermal paste, thermal grease, or even thermal pads, is placed between the heatsink and the component to ensure thermal contact. Due to the mechanical tolerances present between the component and the heatsink, the thickness of the layer of thermal interface material varies from one electronic package to another. Consequently, the cooling performance varies which can lead to overheating of the component or of other sensitive components on the electronic board. This solution is therefore not satisfactory in terms of thermal performance.

In order to remedy this drawback, it has been proposed to also screw the heatsink onto the electronic board on either side of the component to be cooled. Thus, the thickness of thermal interface material applied is reproducible and of controlled thickness. However, this additional mechanical coupling adds an additional constraint which causes the electronic board to bend locally. This second solution is not satisfactory since it induces additional stress on the electronic board.

In order to remedy this drawback, it has been proposed, in a third solution, to fix the heatsink directly on the electronic board. This third solution is not satisfactory since it involves an additional sub-assembly step and therefore the storage of additional elements. Moreover, since the heatsink typically weighs of the order of 50 to 200 grams for the intended applications, in the presence of vibrations, the soldered joints or the tracks can break. In addition, the electronic board is subjected to dynamic stress generated at each vertical acceleration, for example when the vehicle passes over a pothole, and this too has an impact on the integrity of the electronic board in terms of cyclic fatigue.

In order to remedy this drawback, it has been proposed, in a fourth solution, to fix the heatsink on the electronic board and on the cover. Since the cover is rigid, the structural stability of the assembly is thus improved. However, with this solution, the position of the electronic board within the rigid enclosure is difficult to adjust because it is defined by the cover/electronic board/cooler assembly. It is therefore necessary to add new tolerances by enlarging, for example, holes intended to receive connectors on the enclosure of the chassis. This solution is not feasible since it is necessary to limit the ingress of solid and liquid foreign bodies into the electronic package. This can also pose a problem if it is envisaged to connect several electronic boards together directly by means of connectors fixed to each of the boards.

There is therefore a need for a cooling solution compatible with all these issues.

SUMMARY OF THE INVENTION

An aim of the present disclosure is to remedy the drawbacks of the prior art.

An aspect of the present disclosure is a cooling solution making it possible to effectively cool the component while guaranteeing good integrity of the component and of the electronic board on which the component is fixed.

An aspect of the present disclosure is to limit production costs by limiting the number of assembly steps and storage costs by limiting the number of parts to be assembled.

A set of electronic package elements intended to be mounted on an electronic board comprising a component to be cooled is proposed, wherein:
said set includes:
  a rigid chassis containing a heatsink intended to cool the component, said heatsink being fixed inside the chassis,
  a rigid cover configured to be fixed on the chassis and on the electronic board so as to hold the electronic board in the electronic package,
  the heatsink is configured to be fixed on the electronic board while maintaining a predetermined distance between a face of the heatsink intended to be in thermal contact with the component to be cooled and said component, and
  the cover is configured to be able to be fixed by a fixing point to the heatsink.
In addition, the heatsink is fixed by means of a retaining piece integral with the interior of the chassis, the retaining piece being elastically connected to the heatsink so as to allow the heatsink a translational movement relative to the chassis in three orthogonal directions.

According to another aspect, an electronic package is proposed comprising:

a set of electronic package elements as described hereinabove, and an electronic board on which is mounted a component to be cooled, wherein the electronic board is fixed on an internal face of the cover, the cover being fixed on the chassis, a face of the heatsink intended to be in thermal contact with the component to be cooled is fixed on the electronic board so as to maintain a predetermined distance between said face of the heatsink and the component, said face of the heatsink also being fixed to the cover at a fixing point, and a layer of thermal interface material is placed between said face of the heatsink and the component.

According to another aspect, there is proposed a method for mounting an electronic package, the method comprising the following steps:

a. providing a set of electronic package elements as described hereinabove,
b. providing an electronic board comprising a component to be cooled,
c. placing the chassis in a holding device suitable for assembling the electronic package,
d. applying a layer of thermal interface material on one face of the heatsink or one face of the component,
e. placing one side of the electronic board in contact with the chassis,
f. placing the cover in contact with the electronic board,
g. fixing the electronic board on the chassis,
h. fixing the cover on the chassis,
i. fixing said face of the heatsink on the electronic board so as to maintain a predetermined distance between said face of the heatsink and the component, and
j. fixing said face of the heatsink on the cover at a fixing point.

The features disclosed in the paragraphs below can optionally be implemented. They can be implemented independently of each other or in combination with each other:

the retaining piece is connected to the heatsink by at least three elastically deformable arms configured to allow the heatsink a translational movement in the three orthogonal directions;

each elastically deformable arm extends substantially in a plane and wherein one end of each arm is connected to the heatsink by a pivot joint perpendicular to the plane;

the heatsink comprises a plurality of cooling fins parallel to a reference plane, and the retaining piece comprises two walls opposite to each other extending parallel to the reference plane and a wall perpendicular to the reference plane, the two opposite walls being elastically connected to the heatsink and the perpendicular wall being adapted to accommodate a fan;

steps g. and h. of the method are implemented simultaneously and then steps i. and j. of the method are implemented simultaneously.

The proposed solution offers many advantages.

Because the distance between the face of the heatsink and the face of the component to be cooled, which faces are intended to be in thermal contact with each other, is controlled, it is possible to apply a thickness of thermal interface material, the thickness of which is reproducible and as thin as possible to ensure good cooling performance. Furthermore, the electronic board is not subjected to additional stress during assembly which could damage the electrical contacts or the tracks. The dynamic stress caused by vibrations on the board is also limited. The proposed solution also limits the number of parts to be stored and the number of assembly steps since the heatsink is already mounted in the enclosure. Thus, when mounting the package, all that is needed is for the electronic board to be fixed on the heatsink and the cover and for the cover to be fixed on the enclosure. Furthermore, the proposed solution makes it possible to control the position of the electronic board relative to the chassis.

The use of elastically deformable arms has the advantage of allowing a fluid movement of the heatsink in the three directions without risk of blockage and without generation of sound noise contrary to what could be obtained by the use of prismatic connections, i.e. by the use of cascading slides, for example. Furthermore, the elastically deformable arms make it possible to limit the stress exerted on the electronic board by exerting only a slight tension on the board.

Furthermore, the use of the intermediate component makes it possible to integrate new functions. It is for example possible to place a fan on the intermediate component so as to create a flow of air passing from end to end across the space between the fins of the heatsink. This configuration allows for more flexibility in the positioning and orientation of the heatsink relative to the enclosure.

BRIEF DESCRIPTION OF THE DRAWINGS

Other features, details and advantages will become apparent from reading the following detailed description and from examining the appended drawings, in which:

FIG. 3 shows a second perspective view of the heatsink and of the retaining piece of FIG. 2.

FIG. 4 shows a perspective view of a heatsink connected to a retaining piece according to a second embodiment.

DETAILED DESCRIPTION OF THE EMBODIMENTS

The drawings and description below essentially contain elements of definite character. Consequently, they can be used not only to clarify the understanding of the present disclosure, but also to contribute to its definition if necessary.

Figure 1:
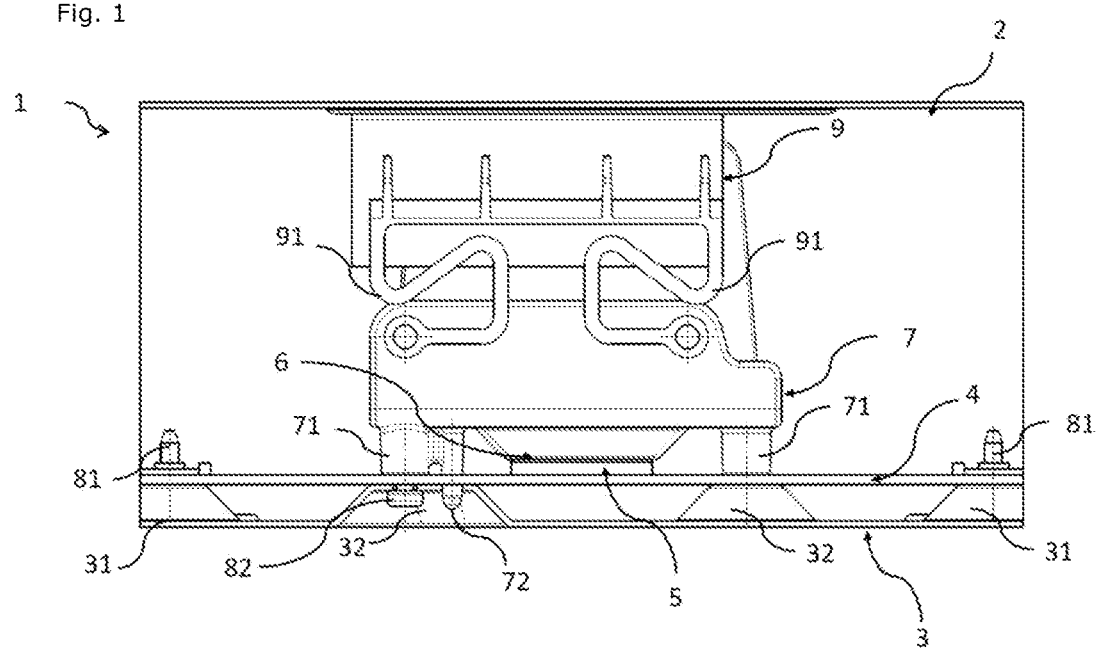
FIG. 1 shows a sectional view of an electronic package according to one embodiment.

Reference is now made to FIG. 1 which illustrates an electronic package according to one embodiment. The electronic package 1 comprises a chassis 2, a cover 3, an electronic board 4 on which is mounted a component 5 to be cooled, a heatsink 7 and a retaining piece 9. A layer of thermal interface material 6 such as thermal paste, thermal grease or a thermal pad, for example, is placed between a lower face of the heatsink 7 and an upper face of the component 5 in order to ensure thermal contact between the heatsink 7 and the component 5 and allow the dissipation of heat generated by the component 5 towards the heatsink 7.

The cover 3 is configured to be fixed on the chassis 2 and on the electronic board 4 so as to hold the electronic board 4 in the electronic package 1. Thus, the cover 3 comprises two recesses 31 each intended to receive a screw 81 making it possible to fix the electronic board 4 and the cover 3 on the chassis 2. It will be noted that the chassis 2 and the cover 3 are both rigid in order to guarantee good integrity of the component 5 and of the electronic board 4. The chassis 2 and the cover 3 are made of sheet metal for example.

The chassis 2 contains the heatsink 7 intended to cool the component 5. The heatsink 7, unlike in the prior art described in the introductory part, is fixed to the chassis 2 by means of the retaining piece 9. The retaining piece 9 is fixed integrally inside the chassis, by screwing, crimping, riveting or welding for example, in order to ensure good rigidity of the chassis/retaining piece assembly. Furthermore, the retaining piece 9 is elastically connected to the heatsink 7 so as to allow the heatsink 7 a translational movement relative to the chassis 2 in three orthogonal directions. This then reduces the stress to which the board is subjected in particular during assembly and therefore the breaking of tracks or electrical contacts. It also limits the dynamic stress when the electronic package is subjected to strong vibrations, for example when the vehicle passes over a pothole, and therefore the cyclic fatigue to which the electronic board is subjected. By way of example, it is possible to provide a translational movement of the order of a few millimeters, for example 2 mm, of the heatsink with respect to the chassis in the three orthogonal directions. This improves the management of tolerances, in particular when it is desired to position several electronic boards side by side and to connect them directly to each other by connectors fixed to each of the boards.

Advantageously, the retaining piece 9 is connected to the heatsink 7 by at least three elastically deformable arms 91 (of which only two are visible here) configured to allow the heatsink 7 a translational movement in three orthogonal directions. In the embodiment described here, two elastically deformable arms 91 are connected to two opposite faces 94 of the retaining piece 9. In a variant embodiment, the opposite face is only connected to a single elastically deformable arm.

The heatsink 7 is configured to be fixed on the electronic board 4 while maintaining a predetermined distance between a lower face of the heatsink 7 and the component 5 in order to guarantee the reproducibility of the cooling and therefore the performance thereof. For this purpose, the heatsink 7 comprises three threaded sleeves 71 and two centering pins 72 more particularly visible in FIG. 3. The centering pins 72 make it possible to center the heatsink 7 on the electronic board 4 on either side of the component 5. It will be noted that the cover 3 has three recesses 32 (of which only two are visible here) intended to allow the mounting of fixing screws 82 on the electronic board 4 and on the threaded sleeves 71.

It will be noted that one of the recesses 32 is configured to fix the cover 3 to the heatsink 7 by an additional fixing point in order to limit the stress applied to the electronic board when the electronic board is fixed at a predetermined distance from the heatsink thanks to the threaded sleeves.

Figure 2:
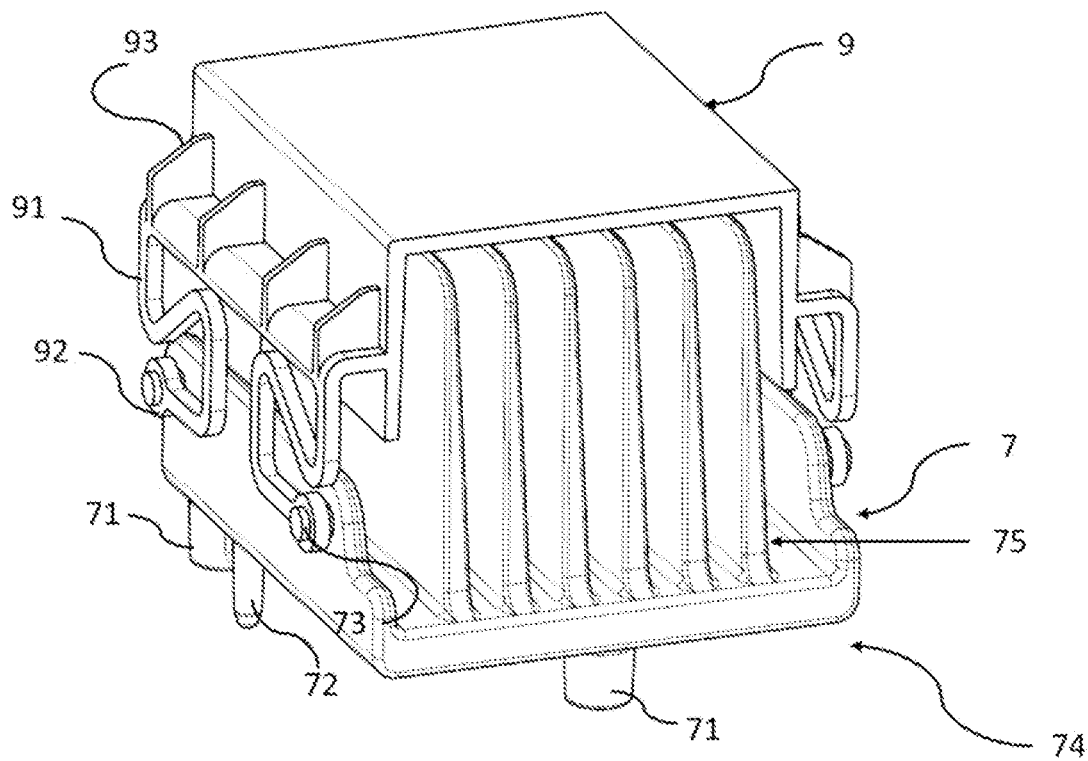
FIG. 2 shows a first perspective view of a heatsink connected to a retaining piece according to a first embodiment corresponding to that of FIG. 1.

FIGS. 2 and 3 illustrate more precisely the configuration of the retaining piece 9 and the heatsink 7 according to two different perspective views.

Referring to FIG. 2, the heatsink 7 comprises a base 74 comprising a bottom wall and two side walls and cooling fins 75 arranged on the bottom wall and oriented parallel to the side walls. The heatsink also comprises, on one side of the bottom wall, the threaded sleeves 71 and the centering pins 72 described previously as well as a boss intended to retain/maintain the layer of thermal interface material 6.

The retaining piece 9 described here is made of synthetic material and comprises a stiffener 93 on two of its opposite walls 94. In a variant embodiment, when the retaining piece 9 is rigid, the retaining piece 9 does not include any stiffener.

Each elastically deformable arm 91 is for example made of synthetic material and configured to be able to deform in three orthogonal directions so as to allow the heatsink a translational movement by a predetermined distance, for example by 2 mm in a plane parallel to the bottom wall of the base and by 2 mm in the direction perpendicular to this plane.

Each elastically deformable arm 91 is connected by one of its ends to a wall 94 of the retaining piece 9 and by another end to a side wall of the base 74. Between these two ends, each elastically deformable arm 91 is of folded shape and comprises several points of inflection. The points of inflection make it possible to reduce the rigidity of the arm at localized points and, in the case of some of them, in directions contained in different planes so as to allow the heatsink a translational movement relative to the retaining piece and therefore relative to the chassis in three orthogonal directions.

In the example described here, each elastically deformable arm 91 extends substantially in a plane and comprises several points of inflection making it possible to reduce the rigidity and allowing the heatsink 7 a translational movement in this plane. Furthermore, each arm 91 comprises a portion perpendicular to the plane of the arm defining a right angle with the rest of the arm allowing the heatsink a translational movement perpendicular to the plane of the arm.

Advantageously, each end 92 of the elastically deformable arm 91 is connected to the heatsink 7 by a pivot joint so as to facilitate the heatsink movement induced by the deformation of the arms. In the example described here, each end 92 of the elastically deformable arm comprises an eyelet 96 intended to accommodate a stud 73. Advantageously, the stud 73 is oriented perpendicular to the plane of the arm.

It will be noted that the use of elastically deformable arms offers certain advantages over the use of prismatic connections. It makes it possible in particular to limit the sound noise generated, to allow fluid movement without risk of blocking and to exert a slight tension on the electronic board which can compensate for the force exerted by screwing the board onto the threaded sleeves.

It will be noted that the presence of a retaining piece 9 makes it easier to integrate certain functions within the electronic package. For example, the retaining piece 9 may comprise, in addition to the two walls 94 opposite to each other to which the elastically deformable arms 91 are connected, a perpendicular wall 95 adapted to accommodate a fan 10. It will be noted that the wall 95 is then perpendicular to the plane defined by the cooling fins 75 in order to optimize the circulation of the flow of air across the heatsink as illustrated by the arrows in FIG. 4. The presence of the retaining piece 9 makes it possible to alleviate the constraints concerning the positioning of the heatsink and more particularly the orientation of the cooling fins with respect to the chassis. Indeed, in the absence of a retaining piece, the position and orientation of the heatsink is constrained by the position of the fan on the chassis.

Advantageously, the electronic package 1 is mounted as follows:
  a. the chassis 2 containing the heatsink 7 and the cover 3 are provided, as well as the fixing screws 81 and 82,
  b. an electronic board 4 comprising a component 5 to be cooled, and which is adapted to be mounted on the cover, is provided,
  c. the chassis 2 containing the heatsink 7 is placed in a holding device suitable for mounting the electronic package,
  d. the layer of thermal interface material 6 is applied on the face of the heatsink 7 intended to be in thermal contact with the component 5 to be cooled or on the face of the component 5 intended to be in thermal contact with the heatsink, depending on the orientation of the chassis in the holding device, e. one side of the electronic board 4 is placed in contact with the chassis 2, f. the cover 3 is placed in contact with the electronic board 4, g. the electronic board 4 is fixed on the chassis 2, h. the cover 3 is fixed on the chassis 2, i. said face of the heatsink 7 is fixed on the electronic board 4 so as to maintain a predetermined distance between said face of the heatsink 7 and the component 5, and j. said face of the heatsink 7 is fixed to the cover 3 at a fixing point.

These different steps can be carried out in the order described here or, for some, in a different order. Similarly, the steps can be carried out sequentially or, for some, simultaneously.

In the embodiment described here, the chassis 2 containing the heatsink 7 is preferably placed in the holding device so that the face of the heatsink 7 intended to be in thermal contact with the component 5 is oriented upwards. In this case, the layer of thermal interface material 6 is deposited on the face of the heatsink intended to be in thermal contact with the component 5 to be cooled. Additionally, steps g. of fixing the electronic board 4 to the chassis 2 and h. of fixing the cover 3 on the chassis 2 are carried out simultaneously by introducing and tightening each fixing screw 81 in the corresponding recess 31. Similarly, steps i. of fixing the face of the heatsink 7 on the electronic board 4 and j. of fixing said face of the heatsink 7 to the cover 3 at a fixing point are carried out simultaneously by fixing the fixing screw 82 in the recess 32.

This reduces the number of steps to be performed when mounting the electronic package. Furthermore, by performing steps g. and h. then steps i. and j., the stress applied to the electronic board is limited since the electronic board 4 is fixed to the rigid chassis 2 and to the rigid cover 3 before the heatsink 7 is fixed to the electronic board 4.

In addition, the position of the electronic board can be centered with respect to the chassis when the electronic board has suitable bores. Thus, the tolerances to be applied to the chassis for the positioning of the connectors are reduced, which makes it possible to limit the ingress of solid and liquid foreign bodies into the electronic package. In addition, several electronic boards can be easily connected together directly by means of connectors fixed to each of the boards since the position of the electronic boards is defined with respect to the chassis.

It will also be noted that, since the heatsink is mounted in the chassis, the number of parts to be stored is reduced and therefore the costs associated with the storage and assembly of the electronic package are reduced.

The present disclosure is not limited to the example of electronic package described above but encompasses all the variants that a person skilled in the art may consider within the framework of the protection sought.

The invention claimed is:

1. A set of electronic package elements intended to be mounted on an electronic board comprising a component to be cooled, wherein:

said set includes:

a rigid chassis containing a heatsink intended to cool the component, said heatsink being fixed inside the chassis; and a rigid cover configured to be fixed on the chassis and on the electronic board so as to hold the electronic board in the electronic package, the heatsink is configured to be fixed on the electronic board while maintaining a predetermined distance between a face of the heatsink intended to be in thermal contact with the component to be cooled and said component, and the cover is configured to be able to be fixed by a fixing point to the heatsink, wherein the heatsink is fixed by mews of a retaining piece integral with the interior of the chassis, the retaining piece being elastically connected to the heatsink so as to allow the heatsink a translational movement relative to the chassis in three orthogonal directions.

2. The set of electronic package elements as claimed in the claim 1, wherein the retaining piece is connected to the heatsink by at least three elastically deformable arms configured to allow the heatsink a translational movement in the three orthogonal directions.

3. The set of electronic package elements as claimed in the claim 2, wherein each elastically deformable arm extends substantially in a plane and wherein one end of each arm is connected to the heatsink by a pivot joint perpendicular to the plane.

4. The set of electronic package elements as claimed in any claim 1, wherein:

the heatsink comprises a plurality of cooling fins parallel to a reference plane, and the retaining piece comprises two walls opposite to each other extending parallel to the reference plane and a wall perpendicular to the reference plane, the two opposite walls being elastically connected to the heatsink and the perpendicular wall being adapted to accommodate a fan.

5. An electronic package comprising:

a set of electronic package elements as claimed in claim 1, and an electronic board on which is mounted a component to be cooled, wherein the electronic board is fixed on an internal face of the cover, the cover being fixed on the chassis, a face of the heatsink intended to be in thermal contact with the component to be cooled is fixed on the electronic board so as to maintain a predetermined distance between said face of the heatsink and the component, said face of the heatsink also being fixed to the cover at a fixing point, and a layer of thermal interface material is placed between said face of the heatsink and the component.

6. A method for mounting an electronic package, the method comprising:

a. providing a set of electronic package elements as claimed in claim 1, b. providing an electronic board comprising a component to be cooled, c. placing the chassis in a holding device suitable for assembling the electronic package, d. applying a layer of thermal interface material on one face of the heatsink or one face of the component, e. placing one side of the electronic board in contact with the chassis, f. placing the cover in contact with the electronic board, g. fixing the electronic board on the chassis, h. fixing the cover on the chassis, i. fixing said face of the heatsink on the electronic board so as to maintain a predetermined distance between said face of the heatsink and the component, and
j. fixing said face of the heatsink on the cover at a fixing point.

7. The method of mounting an electronic package as claimed in claim 6, in which steps g. and h. are implemented simultaneously then steps i. and j. are implemented simultaneously.

* * * * *

UNITED STATES PATENT AND TRADEMARK OFFICE
CERTIFICATE OF CORRECTION

PATENT NO. : 11,856,734 B2
APPLICATION NO. : 18/012350
DATED : December 26, 2023
INVENTOR(S) : Jean-Philippe Bekaert and Gilles Le Roy It is certified that error appears in the above-identified patent and that said Letters Patent is hereby corrected as shown below:

In the Claims

Column 8, Line 11, delete "mews of".

Column 8, Line 17, "as claimed in the" should read -- as claimed in --.

Column 8, Line 22, "as claimed in the" should read -- as claimed in --.

Column 8, Line 28, "any" should be deleted.

Signed and Sealed this
Fourteenth Day of May, 2024

Katherine Kelly Vidal
*Director of the United States Patent and Trademark Office*